United States Patent
Kim et al.

(10) Patent No.: US 11,220,434 B2
(45) Date of Patent: Jan. 11, 2022

(54) SILICON CARBIDE POWDER AND METHOD OF PREPARING THE SAME USING A HYDROPHOBIC SPHERICAL SILICA AEROGEL

(71) Applicants: LG CHEM, LTD., Seoul (KR); INHA UNIVERSITY RESEARCH AND BUSINESS FOUNDATION, Incheon (KR)

(72) Inventors: Young Hun Kim, Daejeon (KR); Je Kyun Lee, Daejeon (KR); Hae Jin Hwang, Seoul (KR); Kyoung Jin Lee, Gyeonggi-do (KR)

(73) Assignees: LG Chem, Ltd., Seoul (KR); Inha University Research And Business Foundation, Incheon (KR)

( * ) Notice: Subject to any disclaimer, the term of this patent is extended or adjusted under 35 U.S.C. 154(b) by 127 days.

(21) Appl. No.: 16/333,523

(22) PCT Filed: Oct. 24, 2017

(86) PCT No.: PCT/KR2017/011782
§ 371 (c)(1),
(2) Date: Mar. 14, 2019

(87) PCT Pub. No.: WO2018/212414
PCT Pub. Date: Nov. 22, 2018

(65) Prior Publication Data
US 2019/0256360 A1    Aug. 22, 2019

(30) Foreign Application Priority Data

May 18, 2017  (KR) .................. 10-2017-0061876

(51) Int. Cl.
C04B 14/06      (2006.01)
B01J 27/224    (2006.01)
(Continued)

(52) U.S. Cl.
CPC .............. *C01B 32/97* (2017.08); *B01J 27/224* (2013.01); *C01B 32/956* (2017.08);
(Continued)

(58) Field of Classification Search
CPC ... C01B 32/97; C01B 33/154; C01B 33/1546; C01B 33/158; C01B 33/1585; C01P 2004/61; C01P 2004/62
(Continued)

(56) References Cited

U.S. PATENT DOCUMENTS 6,344,240 B1 *  2/2002  Menon ................. C01B 33/149
                                                      106/490
8,894,893 B2 * 11/2014  Ahn ..................... C01B 33/1585
                                                      264/13
(Continued)

FOREIGN PATENT DOCUMENTS

CN      102613245      *   3/2012
CN      103118979 A        5/2013
(Continued)

OTHER PUBLICATIONS

Machine Translation of Ito et al. Japanese Patent JP 2007191364 (Year: 2007).*
(Continued)

*Primary Examiner* — Sheng H Davis
(74) *Attorney, Agent, or Firm* — Dentons US LLP

(57) ABSTRACT

The present invention relates to a method of preparing ultra-pure silicon carbide in which a super-porous spherical silica aerogel is used as a silica raw material. By preparing the silica aerogel particles using low-cost water glass, a reaction area with respect to a carbon raw material is increased to enable low-temperature synthesis of silicon carbide, the size and shape of silicon carbide powder may be uniformly controlled to prepare ultra-pure silicon carbide,
(Continued)

and economic efficiency and productivity of the silicon carbide synthesis may be improved. Thus, it is expected that the silicon carbide powder prepared by the preparation method of the present invention may be provided as an optimized raw material for the preparation of silicon carbide sintered body and single crystal (ingot).

24 Claims, 6 Drawing Sheets

(51) Int. Cl.
*C01B 32/956* (2017.01)
*C01B 32/97* (2017.01)
*C01B 33/154* (2006.01)
*C01B 33/158* (2006.01)
*H01L 29/16* (2006.01)

(52) U.S. Cl.
CPC .......... *C01B 33/154* (2013.01); *C01B 33/158* (2013.01); *C01B 33/1546* (2013.01); *C01B 33/1585* (2013.01); *C04B 14/064* (2013.01); *H01L 29/1608* (2013.01); *C01P 2004/60* (2013.01); *C01P 2004/61* (2013.01); *C01P 2004/62* (2013.01); *C01P 2006/11* (2013.01)

(58) Field of Classification Search
USPC ........................................................ 423/345
See application file for complete search history.

(56) References Cited

U.S. PATENT DOCUMENTS

| | | | | |
|---|---|---|---|---|
| 2009/0087665 | A1* | 4/2009 | Suzuki | C09D 183/04 428/412 |
| 2009/0169458 | A1* | 7/2009 | Tanaka | C01B 32/977 423/345 |
| 2012/0225003 | A1* | 9/2012 | Joung | C01B 33/166 423/338 |
| 2013/0129599 | A1 | 5/2013 | Kim et al. | |
| 2013/0189521 | A1 | 7/2013 | Fukuju et al. | |

FOREIGN PATENT DOCUMENTS

| | | | |
|---|---|---|---|
| CN | 103864076 | A | 6/2014 |
| CN | 104030301 | A | 9/2014 |
| CN | 107540378 | * | 8/2017 |
| CN | 109422520 | * | 8/2017 |
| JP | 2007191364 | A * | 8/2007 |
| KR | 10-2005-0019828 | A | 3/2005 |
| KR | 10-0758019 | B1 | 9/2007 |
| KR | 10-0972601 | B1 | 7/2010 |
| KR | 10-1084711 | B1 | 11/2011 |
| KR | 10-2012-0012343 | A | 2/2012 |
| KR | 10-2013-0128365 | A | 11/2013 |
| KR | 10-1711015 | B1 | 2/2017 |
| WO | 2008117995 | * | 10/2008 |

OTHER PUBLICATIONS

Synquest Product datasheet for dimethyldichlorosilane [http://synquestlabs.com/product/id/56329.html, 2010] (Year: 2010).*
Santa Cruz Biotechnology [Material Safety Data Sheet for sorbitan monooleate, including specific gravity http://datasheets.scbt.com/sc-281153.pdf, 2011] (Year: 2011).*
SigmaAldrich (Tetraethyl Orthosilicate Product Data, 2012} (Sigma) (Year: 2012).*
Machine Translation of Zhuying et al. Chinese Patent CN103864076 (Year: 2014).*
Fischer (Acetylene Black Product Data, https://www.fishersci.ca/shop/products/carbon-black-acetylene-99-9-alfa-aesar-2/p-4408792, 2016) (Year: 2016).*
Xin, Lipeng, et al. "Morphological Evolution . . . ". Materials Characterization. SciVerse ScienceDirect. 65, 55-61 (2012) (Year: 2012).*
Leventis, Nicholas, et al. "Click Synthesis of Monolithic silicon carbide.". Chem. Mater. 22, 2790-2803 (2010) (Year: 2010).*
Knez, Zeljko, et al. "Incorporation of Drugs and Metals into Aerogels using . . . ". Royal Society of Chemistry. 2018. (Year: 2018).*
Wang, Kun et al. "Synthesis of nanostructured silicon carbide spheres.". The Royal Society of Chemistry. Chem. Commun., 46, 303-305 (2010). (Year: 2010).*
Omidi, Zahra, et al. "Synthesis and Characterization . . . ". Ceramics Int. Science Direct. 41, 5579-5784 (2015) (Year: 2015).*
Gubernat, et al; "Low-Temperature Synthesis of Silicon Carbide Powder Using Shungite"; Boletin De La Sociedad Espanola De Ceramica Y Vidrio; vol. 56, pp. 39-46 (2017).

* cited by examiner

SILICON CARBIDE POWDER AND METHOD OF PREPARING THE SAME USING A HYDROPHOBIC SPHERICAL SILICA AEROGEL

CROSS REFERENCE TO RELATED APPLICATIONS

This application is a National Stage Entry of International Application No. PCT/KR2017/011782, filed on Oct. 24, 2017, and claims the benefit of, and priority to, Korean Application No. 10-2017-0061876, filed on May 18, 2017, all of which are hereby incorporated by reference in their entirety for all purposes as if fully set forth herein.

TECHNICAL FIELD

The present invention relates to a method of preparing silicon carbide powder, in which spherical silica aerogel powder is used as a silica raw material, and silicon carbide powder prepared thereby.

Background Art

Silicon carbide (SiC) does not exist in nature and is a covalent compound in which carbon and silicon are bonded at a ratio of 1:1, wherein, since thermal conductivity is high and thermal expansion coefficient is low, thermal stability is excellent and chemical stability is high even at high temperature. Also, since mechanical strength is high, abrasion resistance is excellent.

Due to these excellent properties, research into the use of the silicon carbide, as a new material capable of overcoming limitations of conventional high-temperature metallic materials, in a heat resistance material for aerospace, a high-performance brake disc, a blanket structural material for fusion power generation, high-temperature materials such as gas-cooled fast reactor (GFR) and very-high-temperature reactor (VHTR) materials, corrosion resistant or chemical resistant parts, an electronic component such as a semiconductor, an abrasive that requires high mechanical strength, and an automotive part has been actively conducted.

In the semiconductor field among these various fields, since silicon carbide has wide bandgap energy (2 to 3 times that of silicon (Si)) and high dielectric breakdown field and thermal conductivity, a SiC device/module has a lower loss during power conversion than a Si device, and thus, application of silicon carbide to a power device, such as a semiconductor usable up to about 500° C., is expected.

When silicon carbide is considered in terms of a ceramic material or a process material for a semiconductor, ultra-high purification of silicon carbide is a characteristic index that is more important than mechanical properties.

With the acceleration in the advancement of the semiconductor industry and the development of high integration and large-diameter substrate technology, since impurities of a semiconductor substrate act as a cause of degradation of characteristics of the semiconductor substrate, ultra-pure silicon carbide parts/jigs used in a semiconductor process are required.

As expectations for silicon carbide, as a new material for a power device which may replace silicon, are increased, an increase in productivity of a silicon carbide bulk single crystal (ingot) is a very important task for cost reduction of a SiC substrate used in the device, and, for this purpose, the present invention attempts to provide a process technique which may synthesize high-purity silicon carbide powder at a lower temperature than a conventional process using spherical silica aerogel particles as a starting silica raw material.

PRIOR ART DOCUMENTS (Patent Document 1) Korean Patent Application Laid-open Publication No. 10-1084711 (publication 2011 Nov. 11)

DISCLOSURE OF THE INVENTION

Technical Problem

An aspect of the present invention provides a preparation method which enables low-temperature synthesis of silicon carbide by increasing a reaction area with respect to a carbon raw material using a super-porous spherical silica aerogel as a silica raw material in order to lower a reaction temperature of a silicon carbide synthesis reaction.

Another aspect of the present invention provides a preparation method in which ultra-pure silicon carbide may be prepared and the size and shape of synthesized silicon carbide powder are uniformly controlled by preparing the spherical silica aerogel by a specific preparation method.

Another aspect of the present invention provides a preparation method which may improve economic efficiency and productivity by preparing the silica aerogel particles using low-cost water glass.

Technical Solution

According to an aspect of the present invention, there is provided a method of preparing silicon carbide which includes steps of:

(1) preparing a mixed solution including a carbon raw material and a silica raw material; and (2) synthesizing silicon carbide by drying the mixed solution and heat treating the dried mixed solution in an inert atmosphere, wherein the silica raw material is a spherical silica aerogel.

Advantageous Effects

According to a method of preparing silicon carbide of the present invention, silicon carbide powder having a uniform shape and a uniform size of 0.01 μm to 1,000 μm may be prepared at a synthesis temperature of 1,400° C. to 1,550° C. which is lower than that of a conventional preparation method in which crystalline or amorphous silica powder is used as a silica raw material, and ultra-pure silicon carbide powder may be prepared at a synthesis temperature of 1,525° C. to 1,550° C.

Also, in a case in which a spherical silica aerogel, in which low-cost water glass is used, is used as a silica raw material for the preparation of silicon carbide powder, cost of the silicon carbide powder may be significantly reduced, a milling process is not required because the prepared powder has low density (tap density) of a non-agglomerated dispersed phase, a high-density silicon carbide product may be manufactured due to a low sintering temperature, and silicon carbide substrate manufacturing costs may be reduced because a sublimation rate may be significantly increased when the prepared powder is used as a raw material for preparing a single crystal.

BRIEF DESCRIPTION OF THE DRAWINGS

The following drawings attached to the specification illustrate preferred examples of the present invention by example, and serve to enable technical concepts of the present invention to be further understood together with detailed description of the invention given below, and therefore the present invention should not be interpreted only with matters in such drawings.

MODE FOR CARRYING OUT THE INVENTION

Figure 1:
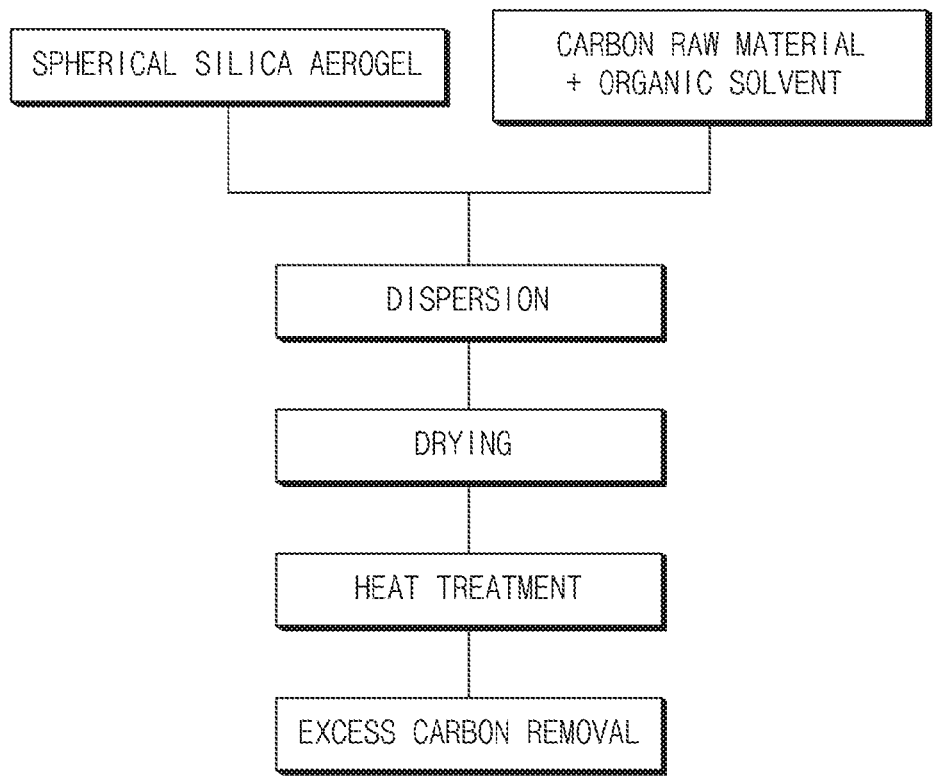
FIG. 1 is a flowchart illustrating a method of preparing silicon carbide of the present invention.

Hereinafter, the present invention will be described in more detail to allow for a clearer understanding of the present invention. In this case, it will be understood that words or terms used in the specification and claims shall not be interpreted as the meaning defined in commonly used dictionaries. It will be further understood that the words or terms should be interpreted as having a meaning that is consistent with their meaning in the context of the relevant art and the technical idea of the invention, based on the principle that an inventor may properly define the meaning of the words or terms to best explain the invention.

The most representative method for preparing silicon carbide powder includes an Acheson method, a silica carbothermal reduction method, or a vapor phase method, and, among these methods, the most commonly used method in the industry is the Acheson method, wherein it is advantageous in that silicon carbide powder may be prepared in a large quantity using a low-cost raw material, but it is disadvantageous in that its process temperature is very high (2,000° C.), there are large amounts of impurities, a milling process and an additional process for high purification are required due to large and non-uniform particle sizes. Silicon carbide powder prepared by the Acheson method is mainly used for abrasives.

With respect to the silica carbothermal reduction method, its process temperature is lower than the Acheson method, but a high temperature of 1,600° C. or more is still required and it is disadvantageous in that process costs are high and productivity is low due to long process time, it is difficult to control a particle size of silicon carbide, and its specific surface area is low. Also, difficulties in obtaining high-purity powder due to a large amount of residual oxygen have emerged as a problem.

A silicon carbide single crystal (SiC ingot) is being manufactured by a 'sublimation-recrystallization method' in which silicon carbide powder is sublimated at a high temperature of about 2,400° C. and reprecipitated, and it is known that productivity of the silicon carbide single crystal manufactured by the process is significantly affected by sublimation properties of the silicon carbide powder as a raw material. Thus, in order to increase the productivity of the silicon carbide single crystal, there is an absolute need to develop a high-purity silicon carbide powder material having excellent sublimation rate and sublimation gas amount.

In order to increase the sublimation rate of the silicon carbide powder, effects of composition, size, shape, and microstructure of the powder on the sublimation rate must be identified and a synthesis process capable of preparing silicon carbide powder having optimal shape and size at a low cost must be secured.

Also, in order to smoothly transport gas into the charged powder in the sublimation process, a pore structure of the silicon carbide powder must be constant and composed of pores having a uniform size, but, since powder synthesized by the Acheson method (prepared by carbothermal reduction of mixed powder of $SiO_2$ and carbon in an inert atmosphere) is milled and used as the silicon carbide powder generally used in the sublimation-recrystallization method, it is disadvantageous in that the sublimation rate is low due to a dense structure and isotropic characteristics.

Thus, there emerges a need to develop a new process capable of preparing silicon carbide powder having shape and microstructure, which may maximize the sublimation rate, at a low cost.

Thus, in the present invention, silicon carbide is synthesized at 1,550° C. or less, which is lower than a conventional reaction temperature, by a carbothermal reduction method using a super-porous spherical silica aerogel prepared from low-cost industrial water glass as a starting material, and a novel method for preparing high-purity silicon carbide powder having low tap density is provided.

Hereinafter, a method of preparing silicon carbide according to an embodiment of the present invention will be described in detail for each step with reference to a flowchart illustrated in FIG. 1.

Step 1)

Step 1) according to an embodiment of the present invention is for preparing a mixed solution including a carbon raw material and a silica raw material.

A type of the carbon raw material used in the present invention is not particularly limited as long as it is in a solid powder state in which it is mixed with silica, but carbon black, dodecane, sacarose, a resin, a pitch, or a mixture thereof may be used. Also, a particle diameter of carbon raw material powder is not limited.

A thermosetting synthetic resin may be used as the resin that is used as the carbon raw material in the present invention, and the thermosetting synthetic resin may include at least one selected from the group consisting of a phenolic resin, a furan resin, an epoxy resin, a polyacrylonitrile resin, a polyimide resin, a polybenzimidazole resin, a polyphenylene resin, a biphenol resin, a divinylbenzene styrene copolymer, and cellulose.

Also, a petroleum pitch or a coal pitch may be used as the pitch that is used as the carbon raw material in the present invention.

In the method of preparing silicon carbide according to the embodiment of the present invention, an organic solvent, such as hexane, ethanol, and acetone, in which a hydrophobic silica aerogel may be mixed, may be specifically used as a solvent usable for mixing the carbon raw material and the silica raw material.

Furthermore, in the present invention, super-porous spherical silica aerogel powder is used as the silica raw material. The reason for this is that, in a case in which the super-porous spherical silica aerogel powder is used as the silica raw material, a reaction area with respect to the carbon raw material is increased to enable low-temperature synthesis of silicon carbide, and furthermore, the spherical silica aerogel powder prepared by a specific preparation method may uniformly control size and shape of silicon carbide powder synthesized.

The spherical silica aerogel powder may be prepared by a method known in the art, but, particularly, in a case in which the spherical silica aerogel powder is prepared by a preparation method including the following steps a) to f), a more desirable effect may be achieved.

Hereinafter, the method of preparing the spherical silica aerogel used in the present invention will be described in detail for each step.

Method of Preparing Spherical Silica Aerogel

The spherical silica aerogel according to an embodiment of the present invention may be prepared by the preparation method including the steps of:

a) preparing a silica precursor solution by mixing a water glass solution and a solvent;

b) adding a surfactant to the silica precursor solution;

c) adding a neutralizer to the silica precursor solution to form a silica sol;

d) adding a gelling agent to the silica sol to form a silica gel;

e) preparing a hydrophobic silica gel by solvent substitution and surface modification of the silica gel; and f) drying the hydrophobic silica gel.

Step a)

First, step a) of the method of preparing the spherical silica aerogel of the present invention is for preparing a silica precursor solution by mixing a water glass solution and a solvent.

The water glass solution may represent a dilute solution in which distilled water is added to water glass and mixed, wherein the water glass may be sodium silicate ($Na_2SiO_3$), as an alkali silicate salt obtained by melting silicon dioxide ($SiO_2$) and alkali, and the water glass solution having a concentration of 28% to 30% may be used.

After a metal alkoxide material, such as trimethoxysilane (TMOS) and tetraethoxysilane (TEOS), is dispersed in a solvent such as ethanol or isopropanol, a silica precursor is obtained through polymerization and hydrolysis of the alkoxide material. However, in a case in which the TMOS or TEOS is used as the silica precursor, since the TMOS or TEOS is relatively expensive, production costs are high, and thus, economic efficiency and productivity may be poor.

Therefore, in the present invention, silica aerogel manufacturing costs and furthermore, silicon carbide manufacturing costs may be significantly reduced by using low-cost industrial water glass as a starting material.

Typically, since water glass is easily gelated according to a change in pH of a solvent mixed, different solvents may be used before and after the gelation for stabilization in the preparation of a silica aerogel. Specifically, before the gelation, the solvent, which does not react with the water glass, may be used, and, after the gelation, a type of the solvent used may be limited to a solvent suitable for mixing with a material formed after the gelation.

Thus, in a case in which the water glass solution and the solvent are mixed, the water glass solution and the solvent are not reacted with each other, but spherical droplets of the water glass solution may be formed and included in the silica precursor solution.

In an embodiment of the present invention, the solvent, which may be used in the preparation of the silica precursor solution of step a), is a solvent that does not cause a change in pH of the water glass, wherein, specifically, a hydrophobic non-polar organic solvent may be used, and, for example, hexane or cyclopentane may be used.

Step b)

Next, step b) of the method of preparing the spherical silica aerogel of the present invention is for adding a surfactant to the silica precursor solution.

The surfactant is a material which increases activity at an interface and significantly changes properties by being adsorbed on the surface of a liquid, wherein, in the present invention, it plays a role in preventing agglomeration of the droplets of the water glass solution in the silica precursor solution and stabilizing the droplets of the water glass solution.

That is, in the present invention, since the surfactant is adsorbed on the surface of the water glass solution by adding the surfactant to the silica precursor solution, uniform-sized droplets of the water glass solution may be formed and the droplets of the water glass solution may be uniformly dispersed in a solvent such as hexane.

The droplets having a uniform diameter of 1 μm to 1,000 μm of the water glass solution, which are uniformly dispersed in the solvent, may allow gelation, solvent substitution, and surface modification processes to be performed in a short period of time, and thus, a total process time of the silica aerogel preparation may be reduced within 1 hour to 5 hours, for example, 1 hour to 2 hours. The expression "total process time" used in the present specification denotes a time in which all steps from step a) to step f) of the method of preparing the spherical silica aerogel of the present invention are performed.

Thus, since the present invention may address limitations of a conventional method of preparing a silica aerogel, in which prolonged solvent substitution and surface modification processes have been required, by significantly shortening the process time, the present invention is advantageous in that productivity is increased to reduce product prices and thus, mass production is possible.

Specifically, the surfactant of step b) used in the present invention may be at least one selected from the group consisting of sorbitan monooleate, sorbitan monostearate, sorbitan monopalmitate, and sorbitan monolaurate, and, for example, the surfactant may be sorbitan monooleate (SPAN 80).

The surfactant may be used in an amount of 3.0% to 9.0%, for example, 3% to 7%, based on the silica precursor solution, but the range and optimum amount of the surfactant may vary depending on a composition ratio (water glass:hexane) of the silica precursor solution. In a case in which the amount of the surfactant used is excessively small at less than 3.0%, it may be difficult to form uniform-sized droplets of the water glass solution, and, in a case in which the amount of the surfactant used is excessively large at greater than 9.0%, small and uniform-sized droplets of the water glass solution may be obtained, but, since the droplets or prepared particles may be agglomerated and the surfactant may remain even after multiple washes, the surfactant may be added in an amount within the above range.

Also, a process sequence, in which the surfactant is added to a specific step, is the most important. Specifically, in the present invention, it is desirable to add the surfactant to the silica precursor solution including the droplets of the water glass solution before the preparation of the silica sol.

In general, since particles of a silica sol have relatively high surface activity, the silica sol has characteristics in which the agglomeration of the particles or non-uniform polymerization/condensation reaction easily occurs. For example, abnormal gelation or heterogeneous particle formation may occur even by standing the silica sol at room temperature without a catalyst. It is possible to form droplets in a short period of time if the surfactant is added to the silica sol having such characteristics, but it is very difficult to maintain a state of the stabilized droplets for a long period of time or uniformly control a size of the droplets, and it may take a long time to perform surface modification and solvent substitution after the gelation. These limitations are not big obstacles in the preparation of a small amount of a silica aerogel at a laboratory level, but when these limitations are applied to a process for mass production, shape and performance of a final product may not be guaranteed. In contrast, since the water glass solution is stable and has low reactivity, its state may be stably maintained even if the water glass solution is exposed to air or moisture. Thus, since it is easy to constantly control the size of droplets when the surfactant is added to the water glass solution to form the droplets, mono-dispersed droplets may be easily prepared and it is possible to stably maintain a state of the uniform-sized droplets even if the droplets are stored for a long time for a subsequent process. Therefore, the addition of the surfactant may be performed before the formation of the silica sol.

Step c)

Next, step c) of the method of preparing the spherical silica aerogel of the present invention is for adding a neutralizer to the silica precursor solution to form a silica sol.

The neutralizer of step c) of the present invention may be used in an amount of 5% to 10%, for example, 5% to 8%, based on the silica precursor solution. In a case in which the amount of the neutralizer used is excessively small at less than 5%, sodium (Na) ions of the water glass, which may act as impurities after the preparation, may not be sufficiently removed, and, in a case in which the amount of the neutralizer used is excessively large at greater than 10%, incomplete gelation may occur due to pH change. Thus, it is desirable to add the neutralizer in an amount within the above range.

After the step c), a step of forming spherical silica sol droplets by stirring at 400 rpm to 800 rpm may be further performed. Since small and uniform-sized silica sol droplets may be obtained as the stirring speed is increased, a size of silica aerogel may be controlled to be small, but actual benefit in terms of effects by weight is not large even if the stirring speed is increased to greater than 800 rpm, and thus, it is desirable to maintain the stirring speed within the above range.

Step d)

Next, step d) of the method of preparing the spherical silica aerogel of the present invention is for adding a gelling agent to the silica sol to form a silica gel.

The gelling agent used in the present invention may be at least one selected from the group consisting of ammonia, acetone, ethanol, and isopropanol.

For example, ammonia in the form of an aqueous solution is added dropwise using a pipette, and pH of the mixed solution is increased by adding the ammonia. In this case, it is desirable to adjust the pH to a range of 5 to 7, and, in a case in which the pH is outside the above range, since gelation time is increased, agglomeration of silica sol droplets occurs. Thus, it may be difficult to prepare spherical powder. Specifically, the pH may be adjusted to a range of 6 to 6.5. In a case in which the pH satisfies the above range, gelation is terminated within 10 minutes, and a spherical silica wet gel may be obtained.

The gelation reaction denotes the formation of a network structure from the silica precursor material, and the network structure may denote a flat net-shaped structure, in which any specific polygons having one or more types of atomic arrangements are connected, or a structure in which a three-dimensional skeleton structure is formed by sharing vertices, edges, and faces of a specific polyhedron.

Also, a step of aging after the gelation may be performed in a temperature range of 30° C. to 80° C.

In a case in which the aging temperature is less than 30° C., aging may not be well performed, and, in a case in which the aging temperature is greater than 80° C., since the temperature is above the boiling point of ethanol, the solvent may be evaporated. In order form the complete network structure in the gel, the aging may be performed in a temperature range of 30° C. to 80° C. for 10 minutes to 24 hours.

Step e)

Next, step e) of the method of preparing the spherical silica aerogel of the present invention is for hydrophobizing the silica gel by performing solvent substitution and adding a surface modifier.

After the wet gel is prepared from the silica precursor such as water glass, a liquid component in the wet gel must be removed without the destruction of a microstructure. In this case, pores of the wet gel are filled with water, wherein, if the solvent is removed through a subsequent drying process, shrinkage and cracking of a pore structure occur due to high surface tension of the water at a gas/liquid interface while the liquid-phase solvent is evaporated into a gas phase. As a result, a decrease in specific surface area and a change in the pore structure occur in a finally prepared silica aerogel. Thus, in order to maintain the pore structure of the wet gel, there is a need to substitute the water having high surface tension with an organic solvent having relatively low surface tension.

A hydrophilic polar organic solvent, specifically, an alcohol-based solvent including a monovalent alcohol such as methanol, ethanol, isopropanol, and butanol; a polyvalent alcohol such as glycerol, ethylene glycol, propylene glycol, diethylene glycol, dipropylene glycol, and sorbitol; and a mixture of two or more thereof may be used as the substituted solvent, i.e., the solvent which may be mixed with the silica gel after the gelation. Specifically, among these alcohols, a monovalent alcohol-based solvent having 1 to 6 carbon atoms, such as methanol, ethanol, isopropanol, or butanol, may be used in consideration of miscibility with water and hydrophobic aerogel.

Also, the dried silica aerogel maintains low thermal conductivity immediately after drying, but it is disadvantageous in that the thermal conductivity is gradually increased because a hydrophilic silanol group (Si—OH) present on the surface of silica absorbs water in the air. Thus, in order to maintain the low thermal conductivity, there is a need to modify the surface of the silica aerogel into hydrophobic.

Thus, in the method of preparing the spherical silica aerogel of the present invention, the hydrophilic gel is modified into a hydrophobic gel by the step of adding the surface modifier, and at least one selected from the group consisting of hexamethyl disilane (HMDS), hexamethyldisiloxane, ethyltriethoxysilane, trimethoxysilanol, triethylethoxysilane, methyltrimethoxysilane, ethyltrimethoxysilane, trimethylchlorosilane (TMCS), and triethylchlorosilane may be used as the surface modifier of the present invention, but the present invention is not limited thereto.

However, the surface modifier may be used in an amount of 5% to 20% based on the silica precursor solution. In a case in which the amount of the surface modifier used is less than 5%, since surface modification rate may be decreased and density of the powder may be increased, a degree of hydrophobicity of the prepared powder may be significantly decreased. In a case in which the amount of the surface modifier used is greater than 20%, it may be difficult to maintain the spherical shape of the silica gel due to high surface modification rate or process costs or manufacturing costs may be significantly increased due to the excessive amount of the surface modifier used.

The surface modification process may be performed at room temperature for about 1 hour, may be repeated about 4 to 6 times, and may be performed at a moderate temperature (60° C. or less) to increase the reaction rate so that the process time and the number of repetitions may be reduced.

Step f)

Next, step f) of the method of preparing the spherical silica aerogel of the present invention is for drying the hydrophobized silica gel.

A high-purity spherical silica aerogel may be prepared by washing a byproduct remaining after the surface modification with a non-polar organic solvent before drying and drying the washed byproduct.

The washing may be specifically performed by using at least one non-polar organic solvent selected from the group consisting of isopropyl alcohol, hexane, heptane, xylene, and cyclohexane.

Also, the drying is atmospheric pressure drying, wherein the dying may be performed in a temperature range of 70° C. to 200° C. The silica aerogel may be prepared by a supercritical drying method or a vacuum extraction method in addition to the atmospheric pressure drying of the present invention, but, in a case in which the supercritical drying method is used, since an auto clave, as expensive equipment, is required and there is a risk of high temperature and pressure, the supercritical drying method is not suitable for mass production and commercialization of the silica aerogel due to production costs and process risk.

In the present invention, in order to address the above limitations, provided is the preparation method which may commercialize a spherical hydrophobic silica aerogel having low density and thermal conductivity by using the atmospheric pressure drying.

The silica aerogel prepared by the preparation method including the steps a) to f) of the present invention may have a uniform-sized spherical shape, low tap density, and a high specific surface area, and thus, workability and flowability are excellent.

The spherical silica aerogel of the present invention may have an average particle diameter ($D_{50}$) of 1 μm to 1,000 μm. In the present invention, the average particle diameter ($D_{50}$), for example, may be measured by using a laser diffraction method or a scanning electron microscope (SEM) image, and the average particle diameter ($D_{50}$ of the particles may be defined as a particle diameter at 50% in a cumulative particle diameter distribution.

Also, small and uniform-sized spherical silica aerogel powder having a density of 0.05 g/cm$^3$ to 0.3 g/cm$^3$ and a specific surface area of 500 m$^2$/g to 900 m$^2$/g may be obtained by the preparation method of the present invention.

Furthermore, in the present invention, even if the spherical silica aerogel prepared by the method of preparing the spherical silica aerogel is used as the silica raw material for the synthesis of silicon carbide, it is important to use the spherical silica aerogel and the carbon raw material at an appropriate ratio in order to prepare ultra-pure silicon carbide having uniform shape and size.

Thus, in the preparation method according to the embodiment of the present invention, the carbon raw material and the spherical silica aerogel are mixed in a molar ratio of 0.01:1 to 100:1, particularly 0.5:1 to 50:1, and more particularly 0.5:1 to 20:1. In a case in which the carbon raw material and the spherical silica aerogel are mixed within the above range, ultra-pure silicon carbide may be more easily prepared at a low reaction temperature.

Step 2)

Step 2) according to an embodiment of the present invention relates to a reaction for synthesizing silicon carbide, wherein the mixed solution is dried and heat-treated in an inert atmosphere.

A heat treatment temperature of step 2) of the preparation method of the present invention is in a range of 1,400° C. to 1,550° C., for example, 1,450° C. to 1,550° C., wherein silicon carbide may be synthesized at a temperature lower than that of the conventional Acheson method or silica carbothermal reduction method. This is an effect due to the use of the super-porous spherical silica aerogel powder as the silica raw material, wherein the reason for this is that the super-porous spherical silica aerogel powder has a larger reaction area, in which the reaction with the carbon raw material may occur, than conventional crystalline or amorphous silica.

Furthermore, in a case in which the heat treatment temperature is in a range of 1,525° C. to 1,550° C., since the silicon carbide synthesis reaction is more sufficiently performed, a silica phase does not remain, and thus, it is advantageous in that silicon carbide having relatively higher purity may be prepared.

The heat treatment is performed in an inert atmosphere, and the inert atmosphere may include at least one selected from the group consisting of argon (Ar), nitrogen ($N_2$), or helium (He).

Also, the preparation method of the present invention may prepare ultra-pure silicon carbide by further including a step of removing impurities of the silicon carbide after the step 2), and, according to an embodiment of the present invention, the impurities may be removed by heat treating the silicon carbide synthesized in step 2) at a temperature of about 1,000° C. for 1 hour to 5 hour in an air atmosphere.

The silicon carbide prepared by the preparation method of the present invention may have an average particle diameter of 0.01 μm to 1,000 μm, for example, 0.1 μm to 100 μm, and the measurement method of the particle diameter is as described above. The reason for which uniformly fine silicon carbide may be prepared is that the spherical silica aerogel has been used as the silica raw material, wherein the silica aerogel prepared by the method of preparing the silica aerogel of the present invention has low tap density and high specific surface area as well as a uniform size, spherical shape.

Thus, in the present invention, since the super-porous spherical silica aerogel is used as the silica raw material, the reaction area with respect to the carbon raw material is increased to enable the low-temperature synthesis of the silicon carbide, and the size and shape of the silicon carbide powder may be uniformly controlled to prepare ultra-pure silicon carbide. Also, since the low-cost water glass is used to prepare the silica aerogel particles, economic efficiency and productivity of the silicon carbide synthesis may be improved. Thus, since it is expected that the silicon carbide powder prepared by the preparation method of the present invention may be provided as an optimized raw material for the preparation of silicon carbide sintered body and single crystal (ingot), extensive use of the silicon carbide powder in related industries is expected.

Hereinafter, examples of the present invention will be described in detail in such a manner that it may easily be carried out by a person with ordinary skill in the art to which the present invention pertains. The invention may, however, be embodied in many different forms and should not be construed as being limited to the examples set forth herein.

Preparation Example 1—Spherical Silica Aerogel Preparation

A water glass solution having a $SiO_2$ content of 7.5 wt % was prepared by adding distilled water to water glass (sodium silicate, YOUNG IL CHEMICAL COMPANY CO., LTD., silica content: 28 to 30 wt %, $SiO_2:Na_2O=3.52:1$), and a silica precursor solution was then prepared by mixing the water glass solution with hexane in a volume ratio of 1:1. A sorbitan monooleate (SPAN80) surfactant was added to the silica precursor solution in a volume ratio of 5%. Thereafter, acetic acid, as a neutralizer, was added to the mixed solution in a volume ratio of 10%, and isopropanol, as a gelling agent, was added in a volume ratio of the mixed solution:the gelling agent of 1:2 to prepare a silica gel. After the solvent except the gelated silica was removed, ethanol was added to perform solvent substitution, and HMDS, as a surface modifier, was added to the mixed solution in a volume ratio of 17%, then stirred, and maintained for about 1 hour. The prepared aerogel was washed with ethanol and then dried in an oven at 110° C. to prepare a hydrophobic spherical silica aerogel.

Example 1

Carbon black having a concentration of 4 wt % was added to hexane, the mixture was ultrasonically dispersed to prepare a homogeneous slurry, and the spherical silica aerogel powder of Preparation Example 1 was added in a molar ratio of 2:1 with respect to the added carbon black to prepare a mixed solution. The mixed solution was dried to prepare powder in which the carbon black and the silica aerogel were uniformly mixed, and the powder was heat-treated at 1,550° C. for 1 hour in an inert atmosphere to synthesize silicon carbide powder.

The carbon black powder remained after the reaction was removed by heat treating the synthesized silicon carbide powder at 1,000° C. for 1 hour in an air atmosphere to prepare pure silicon carbide powder.

Example 2

Silicon carbide powder was prepared in the same manner as in Example 1 except that the silica aerogel powder was added in a molar ratio of 3:1 with respect to the carbon black in Example 1.

Example 3

Silicon carbide powder was prepared in the same manner as in Example 2 except that the heat treatment temperature in the inert atmosphere was set to 1,525° C. in Example 2.

Example 4

Silicon carbide powder was prepared in the same manner as in Example 2 except that the heat treatment temperature in the inert atmosphere was set to 1,500° C. in Example 2.

Example 5

Silicon carbide powder was prepared in the same manner as in Example 2 except that the heat treatment temperature in the inert atmosphere was set to 1,475° C. in Example 2.

Example 6

Silicon carbide powder was prepared in the same manner as in Example 2 except that the heat treatment temperature in the inert atmosphere was set to 1,450° C. in Example 2.

Example 7

Silicon carbide powder was prepared in the same manner as in Example 1 except that the spherical silica aerogel powder of Preparation Example 1 was added in a molar ratio of 1:1 with respect to the carbon black in Example 1.

Comparative Example 1 (Crystalline Silica Powder was Used as Silica Raw Material)

Carbon black having a concentration of 4 wt % was added to hexane, the mixture was ultrasonically dispersed to prepare a homogeneous slurry, and crystalline silica powder was added in a molar ratio of 3:1 with respect to the added carbon black to prepare a mixed solution. The mixed solution was dried to prepare powder in which the carbon black and the crystalline silica powder were uniformly mixed, and the powder was heat-treated at 1,450° C. to 1,550° C. for 1 hour in an inert atmosphere to synthesize silicon carbide powder. The carbon black powder remained after the reaction was removed by heat treating the synthesized silicon carbide powder at 1,000° C. for 1 hour in an air atmosphere to prepare pure silicon carbide powder.

Comparative Example 2 (Amorphous Silica Powder was Used as Silica Raw Material)

Carbon black having a concentration of 4 wt % was added to hexane, the mixture was ultrasonically dispersed to prepare a homogeneous slurry, and amorphous silica powder was added in a molar ratio of 3:1 with respect to the added carbon black to prepare a mixed solution. The mixed solution was dried to prepare powder in which the carbon black and the amorphous silica powder were uniformly mixed, and the powder was heat-treated at 1,525° C. to 1,550° C. for 1 hour in an inert atmosphere to synthesize silicon carbide powder. The carbon black powder remained after the reaction was removed by heat treating the synthesized silicon carbide powder at 1,000° C. for 1 hour in an air atmosphere to prepare pure silicon carbide powder.

Comparative Example 3 (Polygonal Silica Aerogel was Used as Silica Raw Material)

Carbon black having a concentration of 4 wt % was added to hexane, the mixture was ultrasonically dispersed to prepare a homogeneous slurry, and polygonal silica aerogel powder was added in a molar ratio of 3:1 with respect to the added carbon black to prepare a mixed solution. The mixed solution was dried to prepare powder in which the carbon black and the silica aerogel were uniformly mixed, and the powder was heat-treated at 1,550° C. for 1 hour in an inert atmosphere to synthesize silicon carbide powder. The carbon black powder remained after the reaction was removed by heat treating the synthesized silicon carbide powder at 1,000° C. for 1 hour in an air atmosphere to prepare pure silicon carbide powder.

Experimental Example 1: Physical Property Evaluation

In order to compare physical properties of each silicon carbide powder prepared in Examples 1 to 7 and Comparative Examples 1 to 3, tap density, average particle diameter, and the presence of residual silica of each silicon carbide powder were measured, and the results thereof are presented in Table 1 below.

(1) Tap Density (g/cm$^3$)

Tap density was measured using a tap density tester (JV 2000, Copley Scientific). Specifically, after a weight of each silicon carbide was measured by putting the each silicon carbide into a standardized cylinder (25 ml), the cylinder was then fixed to the tap density tester, a noise damping hood was closed, and 2,500 tappings were set. After tapping measurement was completed, a volume of each silicon carbide in the cylinder was measured, and density was measured by calculating a ratio of the weight previously measured to the volume.

(2) Average Particle Diameter (μm)

An average particle diameter was measured by a laser diffraction method using a micro particle size analyzer (LS13 320 MW, Beckman Coulter Inc.). Also, the average particle diameter was confirmed and a microstructure was observed by using a scanning electron microscope (FE-SEM, S-4300, Hitachi).

(3) Confirmation of the Presence of Residual Silica

The presence of residual silica was determined by the presence of a peak of silica phase through XRD analysis of each silicon carbide powder.

TABLE 1

|  | Tap density (g/cm$^3$) | Average particle diameter (μm) | Presence of residual silica |
|---|---|---|---|
| Example 1 | 0.09 | 3.03 | x |
| Example 2 | 0.08 | 2.57 | x |
| Example 3 | 0.085 | 2.59 | x |
| Example 4 | 0.10 | 3.61 | o |
| Example 5 | 0.14 | 2.06 | o |
| Example 6 | 0.13 | 19.71 | o |
| Example 7 | 0.15 | 6.71 | x |
| Comparative Example 1 | 0.45 | 1.62 | o |
| Comparative Example 2 | 0.09 | 2.07 | 1,525° C.: o 1,550° C.: x |
| Comparative Example 3 | 0.29 | 5.70 | x |

As illustrated in Table 1, with respect to Examples 1 to 7 according to the present invention in which the spherical silica aerogel powder was used as the silica raw material, it may be confirmed that silicon carbide powders having excellent physical properties, in which tap densities and particle diameters were relatively uniform, were synthesized even if the powders were heat-treated at a relatively low temperature of 1,450° C. to 1,550° C. in comparison to the conventional preparation method.

Also, among Examples 1 to 7, with respect to Examples 1 to 3 and 7 which were heat-treated at a relatively high temperature of 1,525° C. to 1,550° C., since a peak of silica phase was not present, it may be confirmed that the reaction was sufficiently performed to synthesize ultra-pure silicon carbides with low impurities.

With respect to Comparative Example 1 in which the crystalline silica powder was used as the silica raw material, poor tap density characteristics were obtained, and, different from Examples 1, 2, and 7 of the present invention, since a silica phase was still present even if the heat treatment was performed at a relatively high temperature of 1,550° C., it may be confirmed that silicon carbide having relatively low purity was synthesized.

Furthermore, with respect to Comparative Example 2 in which the amorphous silica powder was used as the silica raw material, tap density similar to that of the present invention was obtained, but, different from Example 3 of the present invention, since a silica phase was still present even if the heat treatment was performed at a relatively high temperature of 1,525° C., it may be confirmed that silicon carbide having relatively low purity was synthesized.

Also, with respect to Comparative Example 3 in which the non-spherical, polygonal silica aerogel was used as the silica raw material, tap density characteristics were inferior to those of the present invention, and it may be understood that it was undesirable because a separate milling process was required due to the formation of hard agglomerated silicon carbide powder as described later.

Experimental Example 2: XRD Analysis

Figure 2:
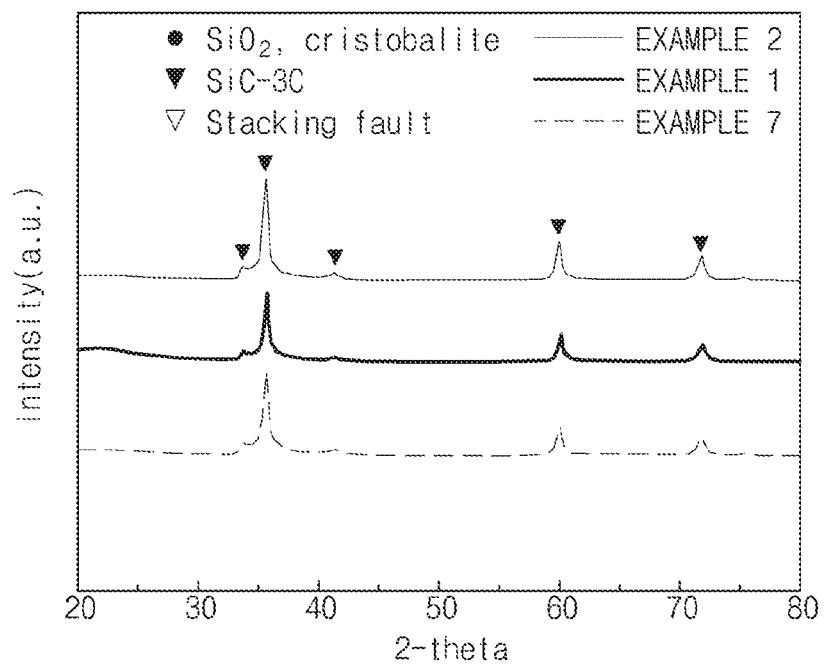
FIG. 2 illustrates X-ray diffraction analysis graphs of Examples 1, 2 and 7 of the present invention according to molar ratios of a silica raw material to a carbon raw material.
Figure 3:
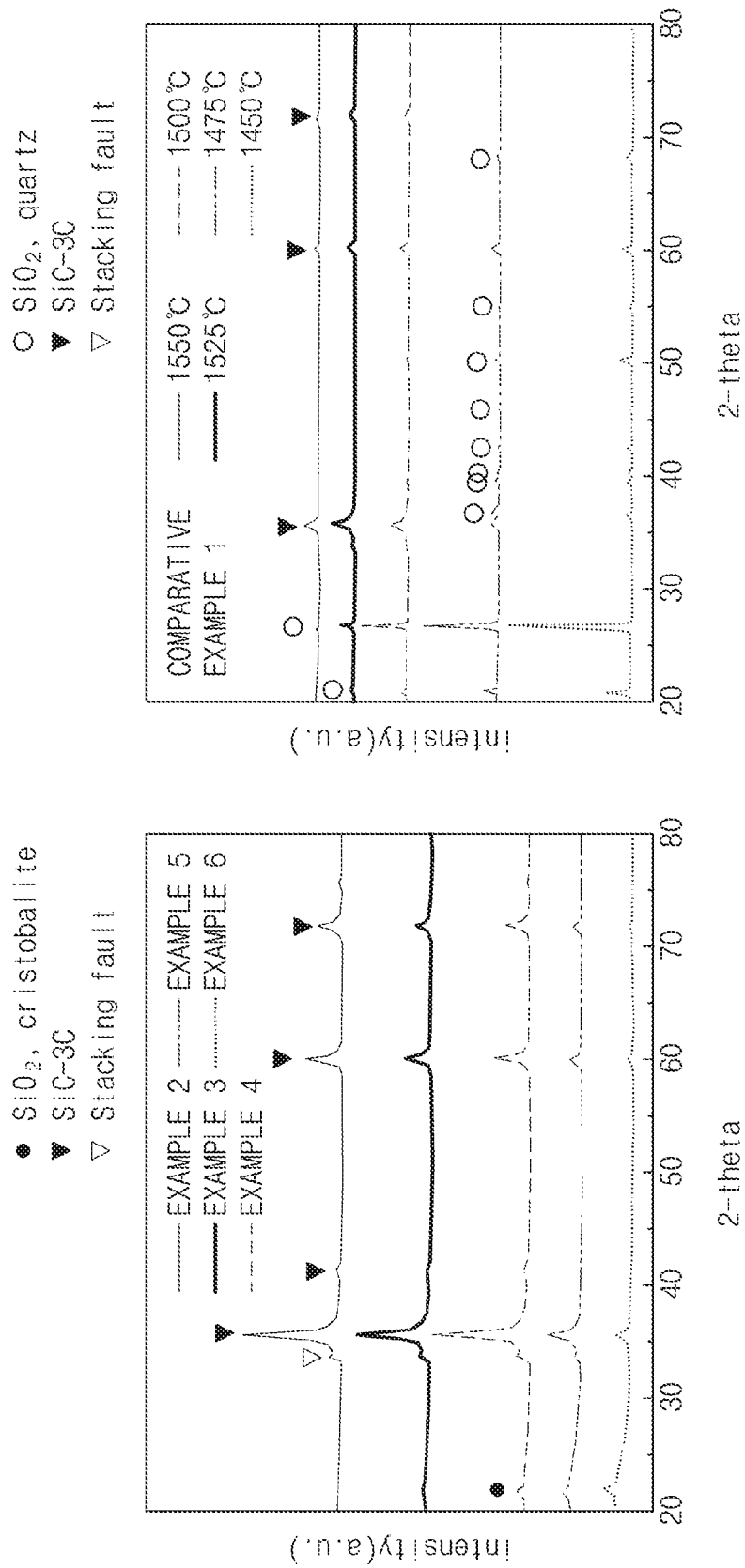
FIG. 3 illustrates X-ray diffraction analysis graphs of Examples 2 to 6 of the present invention and Comparative Example 1 according to types of silica raw materials.
Figure 4:
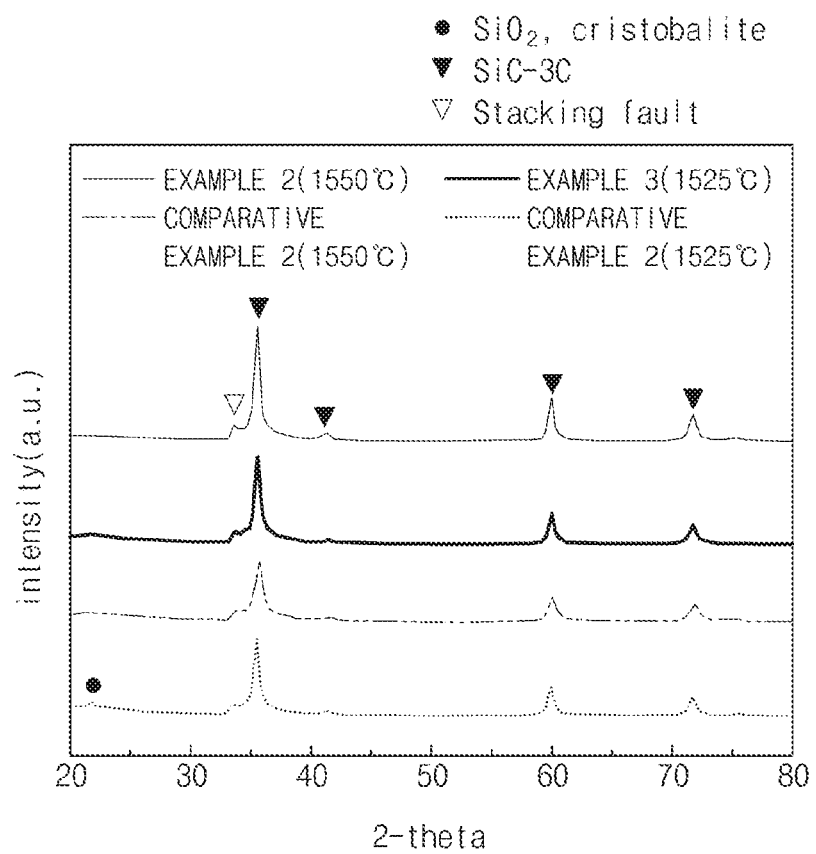
FIG. 4 illustrates X-ray diffraction analysis graphs of Examples 2 and 3 of the present invention and Comparative Example 2 according to types of silica raw materials.

X-ray diffraction (XRD) analysis was performed on each silicon carbide powder prepared in Examples 1 to 7 and Comparative Examples 1 to 3, and the resulting graphs are shown in FIGS. 2 to 4.

FIG. 2 illustrates X-ray diffraction analysis graphs according to molar ratios (Example 1: 2:1, Example 2: 3:1, and Example 7: 1:1) of the spherical silica aerogel to the carbon raw material during the synthesis of the silicon carbide powder prepared in the present invention at 1,550° C.

As illustrated in FIG. 2, it may be confirmed that the preparation method of the present invention may synthesize silicon carbide by performing a heat treatment even at a relatively low temperature of 1,550° C. in comparison to the conventional preparation method, and, since a peak of silica phase was not present, it may be confirmed that the reaction was sufficiently performed even at 1,550° C. to synthesize ultra-pure silicon carbides with low impurities.

FIG. 3 illustrates X-ray diffraction analysis graphs according to the silicon carbide synthesis temperature when the spherical silica aerogel (Examples 2 to 6) and the crystalline silica (Comparative Example 1) were used as the silica raw materials.

As illustrated in FIG. 3, with respect to the silicon carbides (Examples 2 to 6) prepared in the present invention, since a silicon carbide phase began to form at 1,450° C., it may be understood that the silicon carbides were synthesized at a relatively lower temperature than the conventional preparation method. Also, since a peak of silica phase was not present at 1,525° C., it may be understood that ultra-pure silicon carbide may be synthesized above 1,525° C.

In contrast, with respect to Comparative Example 1 in which the crystalline silica powder was used as the silica raw material, it may be confirmed that silicon carbide was only synthesized above 1,500° C., a higher temperature than that of the present invention, and it may also be confirmed that the peak of the silica phase was still present even when the heat treatment was performed above 1,525° C.

FIG. 4 illustrates X-ray diffraction analysis graphs according to the synthesis temperature when the spherical silica aerogel (Examples 2 and 3) and the amorphous silica (Comparative Example 2) were used as the silica raw materials.

As illustrated in FIG. 4, with respect to the silicon carbides (Examples 2 and 3) prepared in the present invention, since a silica phase was not present at 1,525° C., but, when the amorphous silica was used as the silica raw material (Comparative Example 2), it may be confirmed that a silicon carbide phase had lower crystallinity and the silica phase was still remain even at 1,525° C.

Experimental Example 3: Silicon Carbide Photography

Pictures were taken to compare appearances of each silicon carbide powder prepared in Example 2 and Comparative Example 3.

Figure 5:
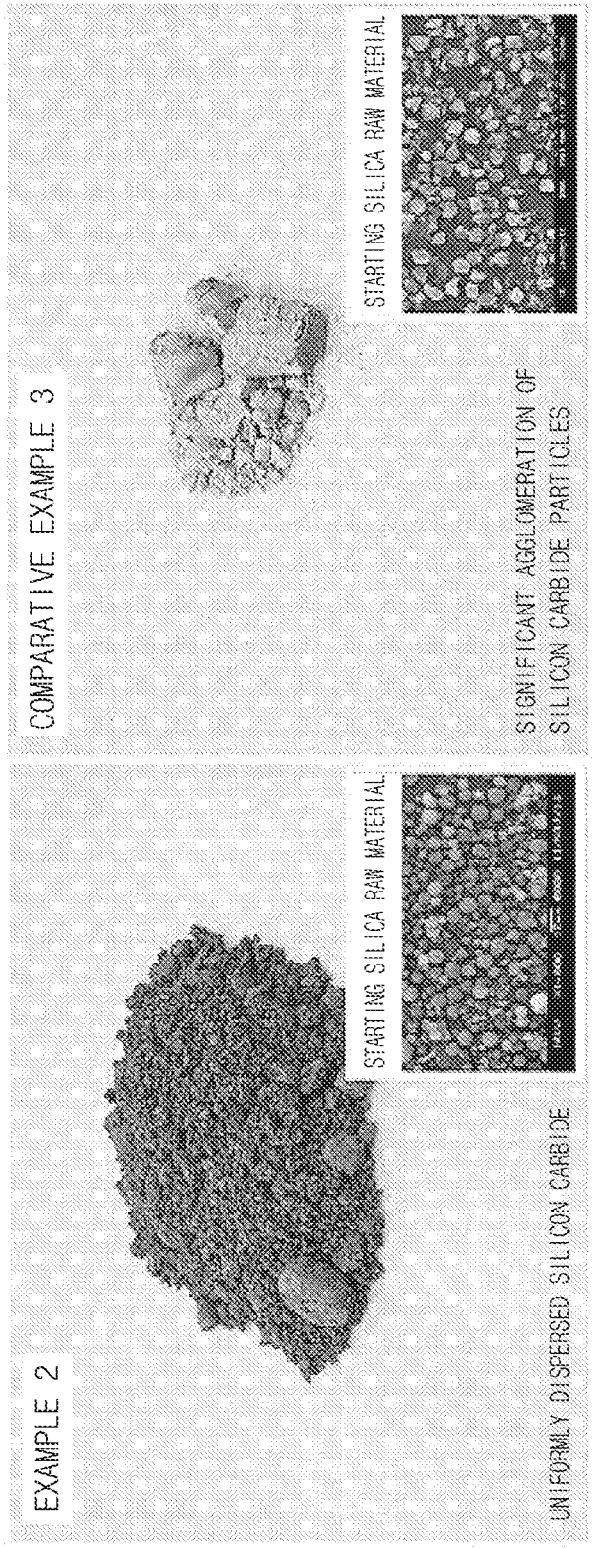
FIG. 5 is images illustrating forms of finally prepared silicon carbide powders of Example 2 of the present invention and Comparative Example 3 according to shapes of silica aerogels used as silica raw materials.

FIG. 5 is images of the silicon carbide powers after the synthesis when the spherical silica aerogel (Example 2) prepared in the present invention was used and the polygonal silica aerogel (Comparative Example 3) was used, wherein, as illustrated in FIG. 5, it may be confirmed that soft dispersed silicon carbide powder was formed when the spherical silica aerogel (Example 2) prepared in the present invention was used, but hard agglomerated silicon carbide powder, which required a subsequent milling process, was formed when the polygonal silica aerogel (Comparative Example 3) was used as the raw material.

Experimental Example 4: Particle Size Distribution

A particle size distribution of each silicon carbide powder prepared in Example 2 and Comparative Example 3 was measured and plotted.

Figure 6:
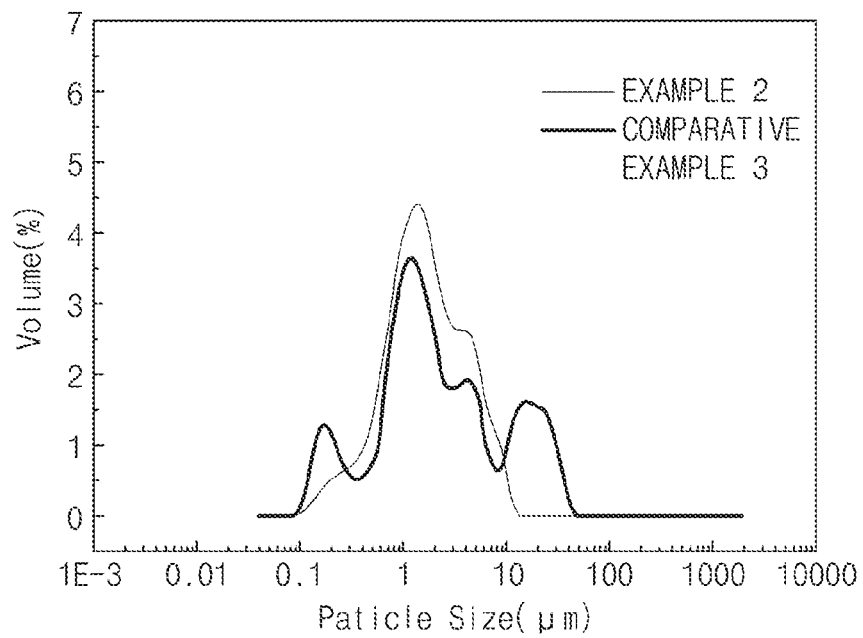
FIG. 6 illustrates particle size distribution graphs of the finally prepared silicon carbide powders of Example 2 of the present invention and Comparative Example 3 according to the shapes of the silica aerogels used as the silica raw materials.

FIG. 6 illustrates particle size distribution graphs of the silicon carbide powders after the synthesis when the spherical silica aerogel (Example 2) prepared in the present invention was used and the polygonal silica aerogel (Comparative Example 3) was used, wherein, as illustrated in FIG. 6, it may be confirmed that the silicon carbide powder (Example 2) prepared in the present invention had a more uniform distribution than the silicon carbide powder prepared when the polygonal silica aerogel (Comparative Example 3) was used as the raw material.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed. Accordingly, it is to be understood that the present invention has been described by way of illustration and not limitation.

The invention claimed is:

1. A method of preparing silicon carbide, the method comprising steps of:
   (1) preparing a mixed solution comprising a carbon raw material and a silica raw material; and
   (2) drying the mixed solution and heat treating the dried mixed solution in an inert atmosphere to synthesize silicon carbide,
   wherein the silica raw material is a spherical silica aerogel, and wherein the spherical silica aerogel has an average particle diameter ($D_{50}$) of 1 μm to 1000 μm.

2. The method of claim 1, wherein a heat treatment temperature of step (2) is in a range of 1,400° C. to 1,550° C.

3. The method of claim 2, wherein a heat treatment temperature of step (2) is in a range of 1,525° C. to 1,550° C.

4. The method of claim 1, wherein the spherical silica aerogel comprises a hydrophobic powder.

5. The method of claim 1, wherein the spherical silica aerogel has a density of 0.05 $g/cm^3$ to 0.3 $g/cm^3$.

6. The method of claim 1, wherein the spherical silica aerogel has a specific surface area of 500 $m^2/g$ to 900 $m^2/g$.

7. The method of claim 1, wherein a molar ratio of the carbon raw material to the spherical silica aerogel is in a range of 0.01:1 to 100:1.

8. The method of claim 1, wherein the inert atmosphere of step (2) comprises at least one selected from the group consisting of argon (Ar), nitrogen ($N_2$), and helium (He).

9. The method of claim 1, further comprising a step of: (3) removing impurities.

10. The method of claim 1, wherein the silicon carbide has an average particle diameter of 0.01 μm to 1,000 μm.

11. The method of claim 1, wherein the spherical silica aerogel is a hydrophobic silica aerogel prepared by a preparation method including steps (a) to (f):
   (a) preparing a silica precursor solution by mixing a water glass solution and a solvent, wherein the solvent does not cause a cause a change in pH of the water glass;
   (b) adding a surfactant to the silica precursor solution;
   (c) adding a neutralizer to the silica precursor solution after the addition of the surfactant to form a silica sol;
   (d) adding a gelling agent to the silica sol to form a silica wet gel;
   (e) preparing the hydrophobic silica aerogel by solvent substitution and surface modification of the silica wet gel; and
   (f) drying the hydrophobic silica aerogel.

12. A method of preparing silicon carbide, the method comprising steps of:
   (a) preparing a silica precursor solution by mixing a water glass solution and a solvent, wherein the solvent does not cause a change in pH of the water glass;
   (b) adding a surfactant to the silica precursor solution;
   (c) adding a neutralizer to the silica precursor solution after the addition of the surfactant to form a silica sol;
   (d) adding a gelling agent to the silica sol to form a silica gel;
   (e) preparing a hydrophobic spherical silica aerogel by solvent substitution and surface modification of the silica gel;
   (f) drying the hydrophobic spherical silica aerogel;
   (g) preparing a mixed solution comprising a carbon raw material and the hydrophobic spherical silica aerogel that has an average particle diameter ($D_{50}$) of 1 μm to 1,000 μm; and
   (h) drying the mixed solution and heat treating the dried mixed solution in an inert atmosphere to synthesize silicon carbide.

13. The method of claim 12, wherein the surfactant of step (b) comprises at least one selected from the group consisting of sorbitan monooleate, sorbitan monostearate, sorbitan monopalmitate, and sorbitan monolaurate.

14. The method of claim 12, wherein the surfactant of step (b) is added in an amount of 3.0% to 9.0% of a total volume of the silica precursor solution.

15. The method of claim 12, wherein the neutralizer of step (c) is added in an amount of 5% to 10% of a total volume of the silica precursor solution.

16. The method of claim 12, wherein the gelling agent of step (d) comprises at least one selected from the group consisting of ammonia, acetone, ethanol, and isopropanol.

17. The method of claim 12, wherein a surface modifier of step (e) is added in an amount of 5% to 20% of a total volume of the silica precursor solution.

18. The method of claim 12, wherein a total process time of steps (a) to (f) of the preparation method is in a range of 1 hour to 5 hours.

19. The method of claim 12, wherein the solvent is a hydrophobic non-polar organic solvent.

20. The method of claim 19, wherein the solvent is hexane or cyclopentane.

21. The method of claim 19, wherein the solvent substitution comprises substituting the hydrophobic non-polar organic solvent of step a) is substituted by a hydrophilic polar organic solvent.

22. The method of claim 21, wherein the hydrophilic polar organic solvent is an alcohol-based solvent including a monovalent alcohol.

23. The method of claim 21, wherein the hydrophilic polar organic solvent is a monovalent alcohol-based solvent having 1 to 6 carbon atoms.

24. The method of claim 12, further comprising, after step c), stirring the silica sol at 400 rpm to 800 rpm.

* * * * *